(12) United States Patent
Sato

(10) Patent No.: US 11,908,631 B2
(45) Date of Patent: Feb. 20, 2024

(54) CAPACITOR AGING APPARATUS AND CAPACITOR AGING METHOD

(71) Applicant: Murata Manufacturing Co., Ltd., Nagaokakyo (JP)

(72) Inventor: Tomohiko Sato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 50 days.

(21) Appl. No.: 17/890,645

(22) Filed: Aug. 18, 2022

(65) Prior Publication Data

US 2022/0392712 A1 Dec. 8, 2022

Related U.S. Application Data

(63) Continuation of application No. PCT/JP2021/007632, filed on Mar. 1, 2021.

(30) Foreign Application Priority Data

Mar. 12, 2020 (JP) ................................. 2020-042886

(51) Int. Cl.
*H01G 9/004* (2006.01)
(52) U.S. Cl.
CPC .................. *H01G 9/004* (2013.01)
(58) Field of Classification Search
CPC ..................................................... H01G 9/004
USPC ........................................................ 307/109
See application file for complete search history.

(56) References Cited

U.S. PATENT DOCUMENTS

2010/0238699 A1* 9/2010 Miyakawa ......... G11C 29/1201
365/201

FOREIGN PATENT DOCUMENTS

| JP | S56167546 U | 12/1981 |
| JP | H8255732 A | 10/1996 |
| JP | H11135386 A | 5/1999 |

OTHER PUBLICATIONS

International Search Report in PCT/JP2021/007632, dated May 25, 2021, 3 pages.

* cited by examiner

*Primary Examiner* — Michael R. Fin
(74) *Attorney, Agent, or Firm* — ArentFox Schiff LLP

(57) ABSTRACT

A capacitor aging apparatus that includes continuity check pads configured to be electrically connected to positive electrodes of a plurality of capacitors in one-to-one correspondence to check electrical continuity with the plurality of capacitors a plurality of first terminals electrically connected to the plurality of continuity check pads; a plurality of second terminals electrically connected to the plurality of first terminals in one-to-one correspondence; and a plurality of connectors configured to be electrically connected to and disconnected from the plurality of first terminals and the plurality of second terminals, and configured to electrically connect the positive electrodes of the plurality of capacitors, the plurality of connectors each allowing a second terminal corresponding to one capacitor of corresponding two capacitors among the plurality of capacitors to be electrically connected to a first terminal corresponding to another capacitor.

20 Claims, 11 Drawing Sheets

CAPACITOR AGING APPARATUS AND CAPACITOR AGING METHOD

CROSS REFERENCE TO RELATED APPLICATIONS

This application is a continuation of PCT Application No. PCT/JP2021/007632, filed Mar. 1, 2021, which claims priority to Japanese Patent Application No. 2020-042886, filed Mar. 12, 2020, the entire contents of each of which are hereby incorporated by reference in their entirety.

TECHNICAL FIELD

The present invention relates to an apparatus for applying a voltage to a capacitor to subject the capacitor to aging, and to a method for aging a capacitor.

BACKGROUND ART

Currently, in manufacturing a capacitor such as an electrolytic capacitor, a voltage is applied to the capacitor to subject the capacitor to aging under a high-temperature environment.

For example, Japanese Patent Application Laid-Open No. 8-255732 (hereinafter "Patent Document 1") describes a method of applying a voltage to a plurality of capacitors connected in parallel to subject the plurality of capacitors to aging at a time.

In order to simplify the method of subjecting the plurality of capacitors to aging at a time, for example, it is conceivable to adopt a method of electrically connecting a plurality of capacitors connected in parallel and an aging apparatus together to subject the plurality of capacitors to aging. FIG. 8 is a diagram schematically illustrating a configuration of an array capacitor 600 in which a plurality of capacitors C61 to C66 each including a positive electrode and a negative electrode are combined into one. In this configuration, the positive electrode and the negative electrode are each formed of an electrode pad. In this case, unless the capacitors C61 to C66 constituting the array capacitor 600 and an aging apparatus are electrically connected together properly and each of the capacitors C61 to C66 is applied with a voltage, each of the capacitors C61 to C66 cannot be subjected to aging processing. Therefore, establishment of reliable electrical connection between the aging apparatus and the positive electrode and the negative electrode of the capacitor needs to be checked before the start of the aging processing.

FIG. 9 is a diagram schematically illustrating an example of an aging apparatus 700 that is to be connected to the array capacitor 600 to perform aging. In this example, it is assumed that the array capacitor 600 includes four capacitors C61 to C64.

The aging apparatus 700 illustrated in FIG. 9 includes a plurality of continuity check pads P61 to P64, a plurality of connection terminals T61 to T64, and a connector L61. The plurality of continuity check pads P61 to P64 are configured to be electrically connected to positive electrodes of the plurality of capacitors C61 to C64 in one-to-one correspondence to check electrical continuity with the plurality of capacitors C61 to C64 in one-to-one correspondence. The plurality of connection terminals T61 to T64 are provided corresponding, respectively, to the plurality of capacitors C61 to C64 and electrically connected respectively to the plurality of continuity check pads P61 to P64. The connector L61 is configured to electrically connect the positive electrodes of the plurality of capacitors C61 to C64. The continuity check pads P61 to P64 and the connector L61 are configured to be electrically connectable to and electrically disconnectable from each other.

The plurality of capacitors C61 to C64 are subjected to aging according to the following method.

First, as illustrated in FIG. 10, the array capacitor 600 is connected to the aging apparatus 700. That is, the positive electrodes of the plurality of capacitors C61 to C64 are electrically connected to the plurality of continuity check pads P61 to P64 in one-to-one correspondence. At this time, the plurality of connection terminals T61 to T64 are electrically disconnected from the connector L61. As further shown, the negative electrodes of the plurality of capacitors C61 to C64 are connected to a ground.

Subsequently, the plurality of continuity check pads P61 to P64 are used to check electrical continuity between the plurality of continuity check pads P61 to P64 and the plurality of capacitors C61 to C64. For example, capacitance of each of the plurality of capacitors C61 to C64 is measured via a corresponding one of the plurality of continuity check pads P61 to P64, thereby checking electrical continuity between the plurality of continuity check pads P61 to P64 and the plurality of capacitors C61 to C64. That is, when the capacitance of each of the plurality of capacitors C61 to C64 can be measured, it is determined that the plurality of continuity check pads P61 to P64 are electrically continuous with the plurality of capacitors C61 to C64, respectively. On the other hand, when there is a capacitor whose capacitance cannot be measured, it is determined that this capacitor is electrically disconnected from the corresponding continuity check pad.

When the electrical continuity between the plurality of continuity check pads P61 to P64 and the plurality of capacitors C61 to C64 can be checked, as illustrated in FIG. 11, the plurality of connection terminals T61 to T64 are electrically connected to the connector L61. Additionally, the continuity check pad P61 located on a first end side of the connector L61 is connected to a power supply VCC, and is applied with a voltage.

In this state, as illustrated in FIG. 11, the plurality of capacitors C61 to C64 are connected in parallel, and are all applied with the voltage of the power supply VCC. This configuration allows the plurality of capacitors C61 to C64 to be subjected to aging at a time.

However, in the aging apparatus 700 described with reference to FIGS. 9 to 11, electrical continuity between the array capacitor 600 and the aging apparatus 700 can be checked, but there is no means for checking establishment of reliable electrical connection between the plurality of connection terminals T61 to T64 and the connector L61, which are in the aging apparatus 700. Therefore, when there is a connection terminal that is not electrically connected to the connector L61 among the plurality of connection terminals T61 to T64, the capacitor provided corresponding to this connection terminal is not applied with a voltage and cannot be subjected to aging.

SUMMARY OF THE INVENTION

The exemplary embodiments of the present invention solve the above described problem. Accordingly, it is an object of the present invention to provide a capacitor aging apparatus and a capacitor aging method that reliably subjects a plurality of capacitors to aging.

In an exemplary aspect, a capacitor aging apparatus is provided for applying a voltage to a plurality of capacitors connected in parallel to subject the plurality of capacitors to aging. In this aspect, the capacitor aging apparatus includes a plurality of continuity check pads configured to be electrically connected to positive electrodes of the plurality of capacitors in one-to-one correspondence to check electrical continuity with the plurality of capacitors in one-to-one correspondence; a plurality of first terminals provided corresponding to the plurality of capacitors in one-to-one correspondence, and electrically connected to the plurality of continuity check pads in one-to-one correspondence; a plurality of second terminals electrically connected to the plurality of first terminals in one-to-one correspondence; and a plurality of connectors configured to be electrically connected to and disconnected from the plurality of first terminals and the plurality of second terminals, and configured to electrically connect the positive electrodes of the plurality of capacitors. Moreover, the plurality of connectors each allow a second terminal corresponding to one capacitor of corresponding two capacitors among the plurality of capacitors to be electrically connected to a first terminal corresponding to another capacitor. When the plurality of capacitors are subjected to aging, in a state where in order to connect the plurality of connectors in series, each of the plurality of connectors is electrically connected to the second terminal corresponding to the one capacitor and the first terminal corresponding to the other capacitor, and where the positive electrodes of the plurality of capacitors are electrically connected to the plurality of continuity check pads, a continuity check pad, among the plurality of continuity check pads, located on a first end side of the plurality of connectors connected in series is applied with a voltage to allow the voltage to be applied to all of the plurality of capacitors via the plurality of connectors.

The capacitor aging apparatus according to the exemplary aspect is configured such that in the state where in order to connect the plurality of connectors in series, each of the plurality of connectors is electrically connected to the second terminal corresponding to the one capacitor of the corresponding two capacitors and the first terminal corresponding to the other capacitor, and where the positive electrodes of the plurality of capacitors are electrically connected to the plurality of continuity check pads, the continuity check pad located on the first end side of the plurality of connectors connected in series is applied with a voltage to allow the voltage to be applied to all of the plurality of capacitors via the plurality of connectors. At this time, the electrical continuity between the plurality of continuity check pads and the plurality of connectors can be checked by measuring the voltage at the second terminal on a second end side of the plurality of connectors connected in series or at a position at the same potential as the second terminal. Furthermore, the electrical continuity between the plurality of capacitors and the capacitor aging apparatus can be checked via the plurality of continuity check pads. With such a configuration, whether or not a voltage is applied to all of the plurality of capacitors can be checked, and thus the plurality of capacitors can be reliably subjected to aging.

DETAILED DESCRIPTION

Hereinafter, features of the present invention will be specifically described with reference to embodiments of the present invention.

First Exemplary Embodiment

Figure 1:
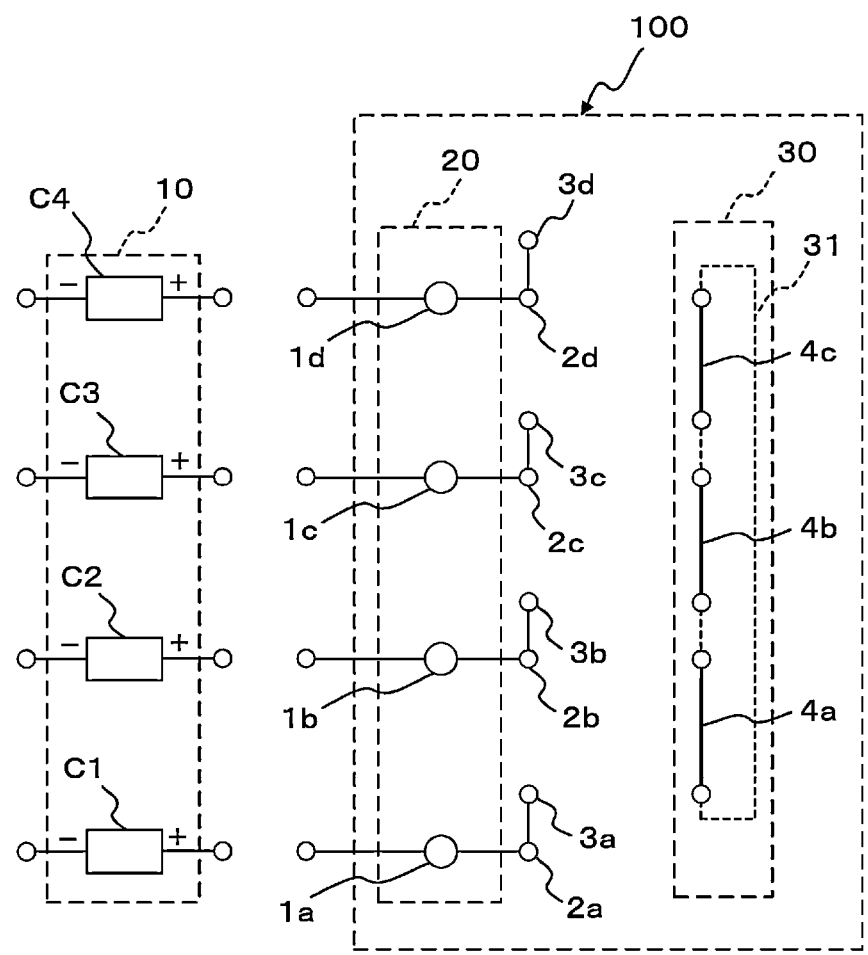
FIG. 1 is a diagram schematically illustrating a configuration of a capacitor aging apparatus according to a first exemplary embodiment.

FIG. 1 is a diagram schematically illustrating a configuration of a capacitor aging apparatus 100 according to a first exemplary embodiment. As shown, the capacitor aging apparatus 100 includes a plurality of continuity check pads 1a to 1d, a plurality of first terminals 2a to 2d, a plurality of second terminals 3a to 3d, and a plurality of connectors 4a to 4c.

In the present embodiment, an example will be described in which an array capacitor 10 is formed by a first capacitor C1, a second capacitor C2, a third capacitor C3, and a fourth capacitor C4; the formed array capacitor 10 is connected to the capacitor aging apparatus 100; and the plurality of capacitors C1 to C4 are subjected to aging at a time. The first capacitor C1 to the fourth capacitor C4 are each, for example, an electrolytic capacitor.

It should be appreciated that the number of capacitors forming the array capacitor 10 can be any number as long as the array capacitor 10 is formed by three or more capacitors. Thus, other exemplary aspects of the array capacitor 10 are not limited to four. Alternatively, each of the plurality of capacitors C1 to C4 can be electrically connected to the capacitor aging apparatus 100 without forming the array capacitor 10 in another exemplary aspect.

The plurality of continuity check pads 1a to 1d are pads for checking electrical continuity with the plurality of capacitors C1 to C4 in one-to-one correspondence by being electrically connected to positive electrodes of the plurality of capacitors C1 to C4 in one-to-one correspondence, respectively. In general, the number of the plurality of continuity check pads 1a to 1d is the same as the number of the plurality of capacitors C1 to C4. In the present embodiment, four continuity check pads are provided, namely a first continuity check pad 1a corresponding to the first capacitor C1, a second continuity check pad 1b corresponding to the second capacitor C2, a third continuity check pad 1c corresponding to the third capacitor C3, and a fourth continuity check pad 1d corresponding to the fourth capacitor C4.

The plurality of first terminals 2a to 2d are provided corresponding respectively to the plurality of capacitors C1 to C4 and are electrically connected respectively to the plurality of continuity check pads 1a to 1d. Specifically, the first terminal 2a is electrically connected to the first continuity check pad 1a, the first terminal 2b is electrically connected to the second continuity check pad 1b, the first terminal 2c is electrically connected to the third continuity check pad 1c, and the first terminal 2d is electrically connected to the fourth continuity check pad 1d. Again, it should be appreciated that the number of the plurality of first terminals 2a to 2d is the same as the number of the plurality of capacitors C1 to C4, and is four in the present embodiment.

Similarly, the plurality of second terminals 3a to 3d are electrically connected to the plurality of first terminals 2a to 2d, respectively. Specifically, the second terminal 3a is electrically connected to the first terminal 2a, the second terminal 3b is electrically connected to the first terminal 2b, the second terminal 3c is electrically connected to the first terminal 2c, and the second terminal 3d is electrically connected to the first terminal 2d. The plurality of second terminals 3a to 3d are also provided corresponding to the plurality of capacitors C1 to C4, respectively. Consequently, the number of the plurality of second terminals 3a to 3d is the same as the number of the plurality of capacitors C1 to C4, and is four in the present embodiment.

As generally shown, the capacitor aging apparatus 100 includes a first member 20 and a second member 30. The first member 20 includes the plurality of continuity check pads 1a to 1d, the plurality of first terminals 2a to 2d, and the plurality of second terminals 3a to 3d. The second member 30 includes the plurality of connectors 4a to 4c, and is attachable to and detachable from the first member 20. That is, in the present embodiment, the plurality of continuity check pads 1a to 1d, the plurality of first terminals 2a to 2d, and the plurality of second terminals 3a to 3d are provided in the first member 20. In an exemplary aspect, the first member 20 can be a substrate.

Moreover, the plurality of connectors 4a to 4c are configured to be electrically connected to and disconnected from the plurality of first terminals 2a to 2d and the plurality of second terminals 3a to 3d. In the present embodiment, the plurality of connectors 4a to 4c are provided in the second member 30. In this exemplary aspect, the second member 30 is a socket, for example. As an example, the plurality of connectors 4a to 4c are connection wires and are provided on a substrate 31 in the socket which is the second member 30.

The plurality of connectors 4a to 4c are for electrically connecting the positive electrodes of the plurality of capacitors C1 to C4 when the plurality of capacitors C1 to C4 are subjected to aging. Each of the plurality of connectors 4a to 4c electrically connects a second terminal corresponding to one capacitor of two capacitors among the plurality of capacitors C1 to C4 with a first terminal corresponding to the other capacitor. Specifically, when aging is performed, one end of the connector 4a is electrically connected to the second terminal 3a corresponding to the first capacitor C1, and the other end of the connector 4a is electrically connected to the first terminal 2b corresponding to the second capacitor C2. Similarly, one end of the connector 4b is electrically connected to the second terminal 3b corresponding to the second capacitor C2, and the other end of the connector 4b is electrically connected to the first terminal 2c corresponding to the third capacitor C3. Likewise, one end of the connector 4c is electrically connected to the second terminal 3c corresponding to the third capacitor C3, and the other end of the connector 4c is electrically connected to the first terminal 2d corresponding to the fourth capacitor C4.

It should be appreciated that the number of the plurality of connectors 4a to 4c is smaller by one than the number of the plurality of capacitors C1 to C4, and is three in the present embodiment.

By attaching the second member 30 to the first member 20, each of the plurality of connectors 4a to 4c is electrically connected to the second terminal corresponding to the one capacitor of the corresponding two capacitors and the first terminal corresponding to the other capacitor. Additionally, by detaching the second member 30 from the first member 20, each of the plurality of connectors 4a to 4c is electrically disconnected from the second terminal corresponding to the one capacitor of the corresponding two capacitors and the first terminal corresponding to the other capacitor.

According to the exemplary aspect, the capacitor aging apparatus 100 is configured such that when the plurality of capacitors C1 to C4 are subjected to aging, in a state where in order to connect the plurality of connectors 4a to 4c in series, each of the plurality of connectors 4a to 4c is electrically connected to the second terminal corresponding to the one capacitor of the corresponding two capacitors and the first terminal corresponding to the other capacitor, and where the positive electrodes of the plurality of capacitors C1 to C4 are electrically connected to the plurality of continuity check pads 1a to 1d, the continuity check pad located on a first end side of the plurality of connectors 4a to 4c connected in series is applied with a voltage to allow the voltage to be applied to all of the capacitors C1 to C4 via the plurality of connectors 4a to 4c. An aging method for the plurality of capacitors C1 to C4 will be described below.

Figure 2:
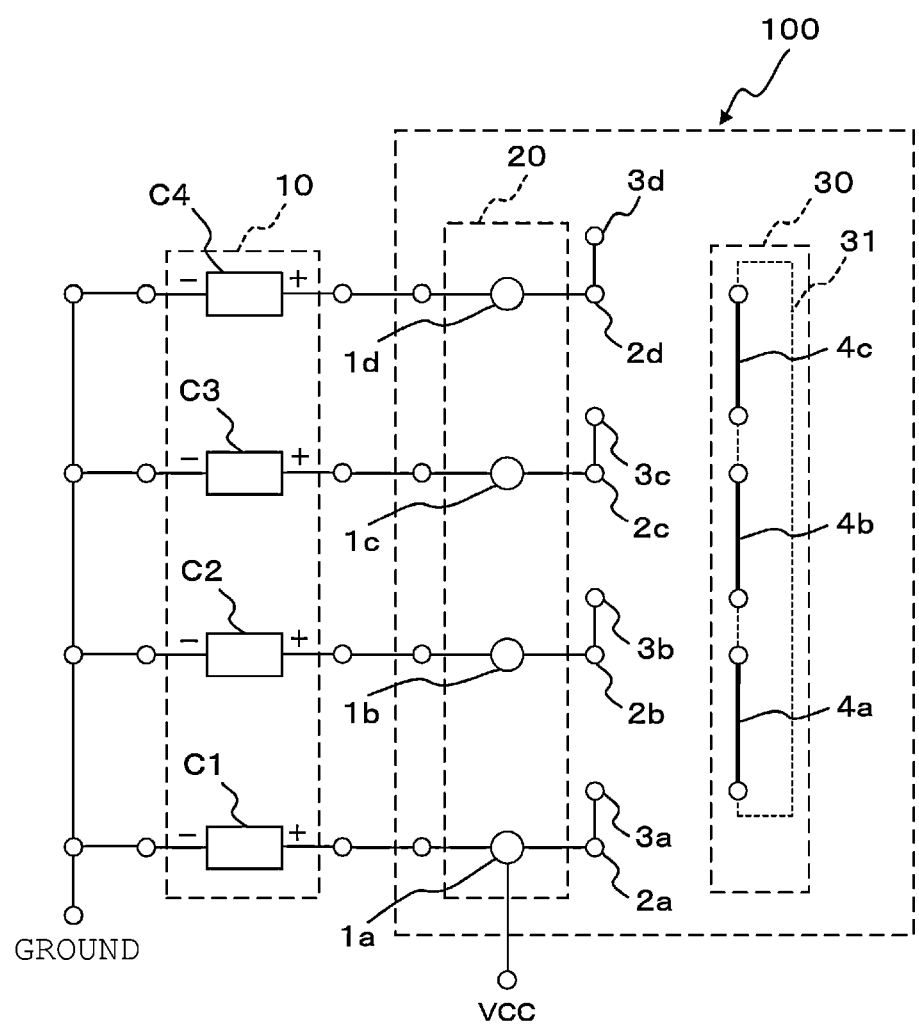
FIG. 2 is a diagram schematically illustrating a connection state where electrical continuity between an array capacitor and a capacitor aging apparatus is checked.

First, as illustrated in FIG. 2, the array capacitor 10 is connected to the capacitor aging apparatus 100. Specifically, the positive electrodes of the plurality of capacitors C1 to C4 of the array capacitor 10 are electrically connected to the plurality of continuity check pads 1a to 1d of the capacitor aging apparatus 100 in one-to-one correspondence. Additionally, negative electrodes of the plurality of capacitors C1 to C4 are connected to a ground. It is noted that at this stage, it has not yet been checked whether the positive electrodes of the plurality of capacitors C1 to C4 are actually electrically continuous with the plurality of continuity check pads 1a to 1d. At this time, the second member 30 is detached from the first member 20, that is, the plurality of continuity check pads 1a to 1d are electrically disconnected from the plurality of connectors 4a to 4c.

Subsequently, the plurality of continuity check pads 1a to 1d are used to check electrical continuity between the plurality of continuity check pads 1a to 1d and the plurality of capacitors C1 to C4. For example, capacitance of each of the plurality of capacitors C1 to C4 is measured via a corresponding one of the plurality of continuity check pads 1a to 1d, thereby checking electrical continuity between the plurality of continuity check pads 1a to 1d and the plurality of capacitors C1 to C4.

For example, when the capacitance of the first capacitor C1 can be measured via the first continuity check pad 1a, it is determined that the first capacitor C1 is electrically continuous with the first continuity check pad 1a. On the other hand, when the capacitance of the first capacitor C1 cannot be measured, it is determined that the first capacitor C1 is electrically disconnected from the first continuity check pad 1a. The same applies to checks for electrical continuity between the second capacitor C2 and the second continuity check pad 1b, between the third capacitor C3 and the third continuity check pad 1c, and between the fourth capacitor C4 and the fourth continuity check pad 1d. In general, it is noted that the capacitance of each of the capacitors C1 to C4 can be checked by a known method as would be appreciated to one skilled in the art.

It is noted that at this time, the negative electrodes of the plurality of capacitors C1 to C4 are each connected to the ground.

Figure 3:
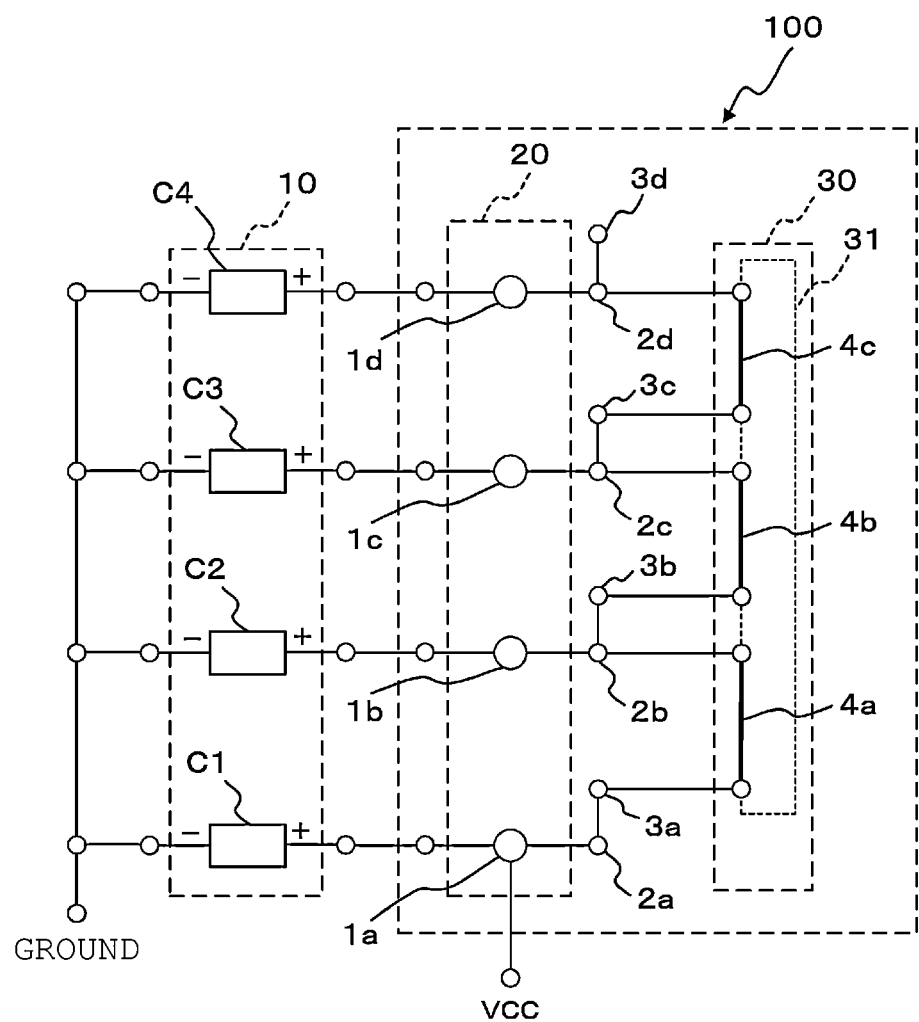
FIG. 3 is a diagram schematically illustrating a connection state where electrical continuity between a first member and a second member of the capacitor aging apparatus is checked and a plurality of capacitors are subjected to aging.

When electrical continuity between the plurality of continuity check pads 1a to 1d and the plurality of capacitors C1 to C4 can be checked in one-to-one correspondence, the plurality of connectors 4a to 4c are connected in series to electrically connect the positive electrodes of the plurality of capacitors C1 to C4. That is, as illustrated in FIG. 3, the second member 30 is attached to the first member 20, and each of the plurality of connectors 4a to 4c is electrically connected to the second terminal corresponding to the one capacitor of the corresponding two capacitors and the first terminal corresponding to the other capacitor in the configuration as described above.

Specifically, one end of the connector 4a is electrically connected to the second terminal 3a corresponding to the first capacitor C1, and the other end of the connector 4a is electrically connected to the first terminal 2b corresponding to the second capacitor C2. Similarly, one end of the connector 4b is electrically connected to the second terminal 3b corresponding to the second capacitor C2, and the other end of the connector 4b is electrically connected to the first terminal 2c corresponding to the third capacitor C3. Likewise, one end of the connector 4c is electrically connected to the second terminal 3c corresponding to the third capacitor C3, and the other end of the connector 4c is electrically connected to the first terminal 2d corresponding to the fourth capacitor C4.

As an example, when the second member 30 is a socket, the connector 4a is electrically connected, via a socket pin, to the second terminal 3a corresponding to the first capacitor C1 and the first terminal 2b corresponding to the second capacitor C2. The same configuration applies to the electrical connections of the connectors 4b and 4c. When proper electrical connections are established at all the connected points, as illustrated in FIG. 3, the plurality of connectors 4a to 4c are connected in series.

Additionally, the continuity check pad located on the first end side of the plurality of connectors 4a to 4c connected in series is applied with a voltage. For purposes of this disclosure, the phrase "first end of the plurality of connectors 4a to 4c connected in series" means one end of a connection body when the plurality of connectors 4a to 4c connected in series is regarded as one connection body. Consequently, the continuity check pad located on the first end side of the plurality of connectors 4a to 4c connected in series is the first continuity check pad 1a corresponding to the first capacitor C1 or the fourth continuity check pad 1d corresponding to the fourth capacitor C4.

In the present embodiment, the first continuity check pad 1a corresponding to the first capacitor C1 is connected to the power supply VCC, and is applied with the voltage of the power supply VCC. However, the power supply VCC is not necessarily intended to be directly connected to the first continuity check pad 1a, and may be connected to any portion electrically connected to the first continuity check pad 1a in the first member 20 (see, e.g., FIG. 1).

Subsequently, electrical continuity between the first member 20 and the second member 30, that is, electrical continuity between the plurality of continuity check pads 1a to 1d and the plurality of connectors 4a to 4c are checked. In the present embodiment, the voltage of the second terminal 3d is measured. In particular, the second terminal 3d is located on a second end side of the plurality of connectors 4a to 4c connected in series and is provided corresponding to the fourth capacitor C4.

Here, when the first member 20 and the second member 30, that is, each of the plurality of connectors 4a to 4c and the corresponding first terminal and second terminal are properly electrically connected together, all the first terminals 2a to 2d and all the second terminals 3a to 3d are electrically connected together via all the connectors 4a to 4c (see FIG. 3). Consequently, when a voltage sensor is connected to the second terminal 3d and measures the voltage of the second terminal 3d, the same voltage as the voltage of the power supply VCC is measured.

That is, when the same voltage as the voltage of the power supply VCC is measured at the time of measuring the voltage of the second terminal 3d, it can be determined that the first member 20 and the second member 30, that is, the plurality of continuity check pads 1a to 1d and the plurality of connectors 4a to 4c are properly electrically connected together based on the measured voltage. In this state, the plurality of capacitors C1 to C4 are connected in parallel, and are all applied with the same voltage as the voltage of the power supply VCC.

On the other hand, when the proper electrical connection is unestablished and electrical disconnection occurs at least at one point between the first member 20 and the second member 30, for example, between the second terminal 3b provided corresponding to the second capacitor C2 and the connector 4b, the current path from the first continuity check pad 1a to the second terminal 3d is cut off. In this case, when the voltage of the second terminal 3d is measured, the measured voltage will not be the same voltage as the voltage of the power supply VCC.

It is noted that when the proper electrical connection is unestablished, at least at one point between the first member 20 and the second member 30, the measured voltage of the second terminal 3d is equal to the voltage corresponding to the electrical charge charged in the capacitor C4, but this voltage will be considerably lower than the voltage of the power supply VCC. Consequently, the voltage of the second terminal 3d is measured, the measured voltage is compared by a voltage comparator, for example, with a predetermined threshold voltage, when the measured voltage is greater than the predetermined threshold voltage, it can be determined that the proper electrical connection is established between the first member 20 and the second member 30, and when the measured voltage is equal to or less than the predetermined threshold voltage, it can be determined that the electrical disconnection has occurred at least at one point.

Additionally, a point where the voltage is measured is not limited to the second terminal 3d, and a voltage at any position electrically connected to the fourth continuity check pad 1d located on the second end side of the plurality of connectors 4a to 4c connected in series may be measured.

A method of performing aging using the capacitor aging apparatus 100 described above will now be summarized. A capacitor aging method for subjecting, using the capacitor aging apparatus 100 according to the first exemplary embodiment, the plurality of capacitors to aging, the capacitor aging method including: (a) checking whether electrical continuity is established between the plurality of continuity check pads 1a to 1d and the positive electrodes of the plurality of capacitors C1 to C4 in a state where the positive electrodes of the plurality of capacitors C1 to C4 are electrically connected to the plurality of continuity check pads 1a to 1d, and where each of the plurality of connectors 4a to 4c is electrically disconnected from the second terminal corresponding to the one capacitor and the first terminal corresponding to the other capacitor; (b) after the check of establishment of electrical continuity between the plurality of continuity check pads 1a to 1d and the positive electrodes of the plurality of capacitors C1 to C4, then electrically connecting each of the plurality of connectors 4a to 4c to the second terminal corresponding to the one capacitor and the first terminal corresponding to the other capacitor. In this state, a voltage is then applied to the continuity check pad located on the first end side of the plurality of connectors 4a to 4c connected in series, and a voltage is measured at a position electrically connected to a continuity check pad, among the plurality of continuity check pads, located on a second end side of the plurality of connectors 4a to 4c connected in series. Finally, the method includes checking whether the voltage is applied to each of the plurality of capacitors C1 to C4 based on the voltage measured.

The exemplary method described above checks that the proper electrical connection is established between the array capacitor 10 and the capacitor aging apparatus 100, and between the first member 20 and the second member 30 of the capacitor aging apparatus 100. When the establishment of the proper electrical connections at all the connected points can be checked, it can be determined that all the capacitors C1 to C4 are applied with a voltage, and all the capacitors C1 to C4 can be reliably subjected to aging at that time and for a set amount of time.

It is also noted that regarding the plurality of second terminals 3a to 3d respectively connected to the plurality of first terminals 2a to 2d, the same effect can be obtained even when a plurality of second terminals are provided for one of the first terminals 2a to 2d. For example, one second terminal 3a is connected to the first terminal 2a, but two or more second terminals may be connected to the first terminal 2a. The same applies to the other first terminals 2b to 2d.

Second Exemplary Embodiment

Figure 4:
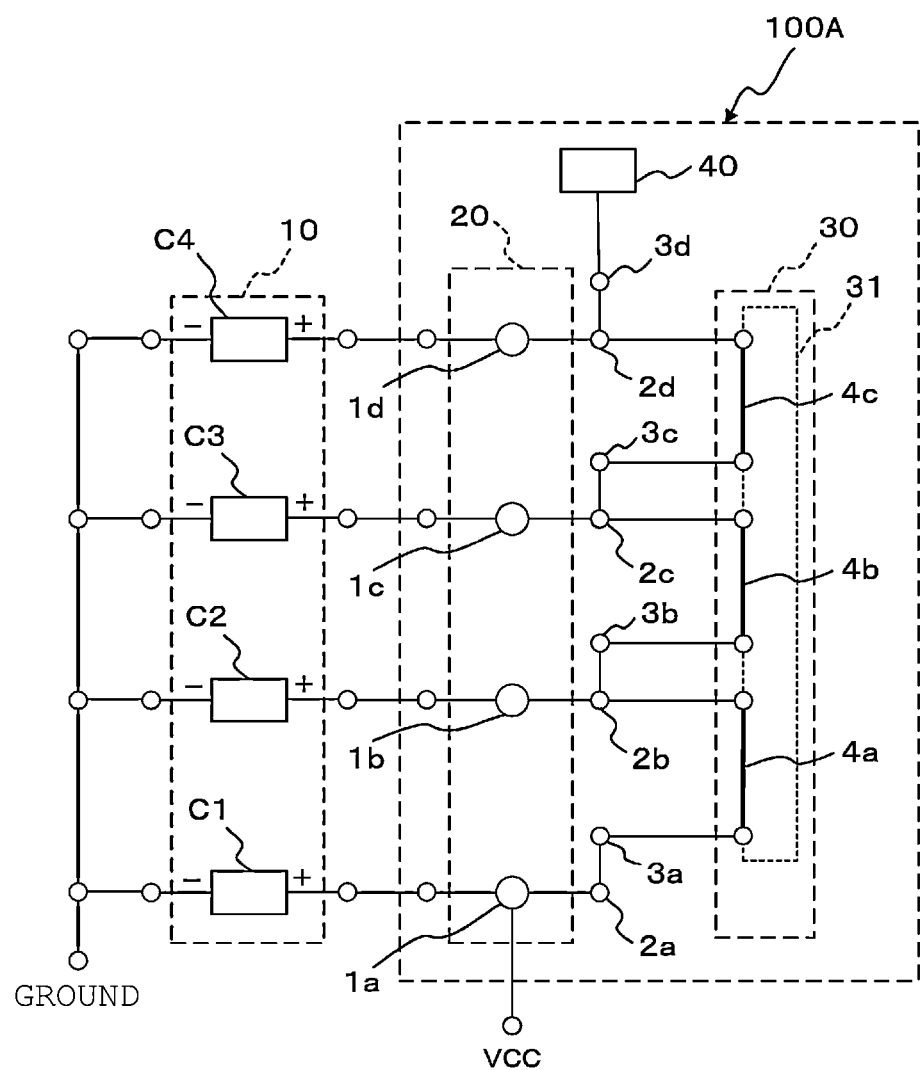
FIG. 4 is a diagram schematically illustrating a configuration of a capacitor aging apparatus according to a second exemplary embodiment, and illustrating a connection state where a plurality of capacitors are subjected to aging.

FIG. 4 is a diagram schematically illustrating a configuration of a capacitor aging apparatus 100A according to a second exemplary embodiment, and illustrating a connection state where a plurality of capacitors C1 to C4 are subjected to aging. The capacitor aging apparatus 100A according to the second embodiment further includes a lighting unit 40 in addition to the configuration of the capacitor aging apparatus 100 according to the first exemplary embodiment.

In particular, the lighting unit 40 is connected to a position electrically connected to the continuity check pad located on the second end side of the plurality of connectors 4a to 4c connected in series, and configured to be turned on in response to application of the voltage to the continuity check pad located on the first end side of the plurality of connectors 4a to 4c connected in series. In the present embodiment, the continuity check pad located on the first end side of the plurality of connectors 4a to 4c connected in series is the first continuity check pad 1a corresponding to the first capacitor C1, and the continuity check pad located on the second end side is the fourth continuity check pad 1d corresponding to the fourth capacitor C4.

As shown in the present embodiment, the lighting unit 40 is connected to the second terminal 3d, which is a position electrically connected to the fourth continuity check pad 1d. However, the lighting unit 40 may be connected to any position as long as the position is electrically connected to the fourth continuity check pad 1d, and may be connected to a position different from the second terminal 3d in alternative aspects. The lighting unit 40 is, for example, an LED.

In the connection state illustrated in FIG. 4, that is, in a state where the plurality of connectors 4a to 4c are connected in series, when the first continuity check pad 1a is applied with the voltage of the power supply VCC, the second terminal 3d is also applied with the same voltage as the voltage of the power supply VCC. As a result, the lighting unit 40 connected to the second terminal 3d is turned on.

That is, according to the capacitor aging apparatus 100A of the second embodiment, in a state where the plurality of connectors 4a to 4c are connected in series, when the lighting unit 40 is turned on in response to application of the voltage to the first continuity check pad 1a located on the first end side, it can be determined that the proper electrical connection is established between the first member 20 and the second member 30, and that all the capacitors C1 to C4 are applied with a voltage. That is, based on whether the lighting unit 40 is turned on or not turned on, whether electrical continuity is established between the first member 20 and the second member 30 can be checked easily, i.e., whether electrical continuity is established between the plurality of continuity check pads 1a to 1d and the plurality of connectors 4a to 4c.

A method for subjecting a plurality of capacitors to aging using the capacitor aging apparatus 100A according to the second exemplary embodiment will be summarized. The capacitor aging method for subjecting, using the capacitor aging apparatus 100A according to the second embodiment, the plurality of capacitors to aging, the capacitor aging method including: (I) checking whether electrical continuity is established between the plurality of continuity check pads 1a to 1d and the positive electrodes of the plurality of capacitors C1 to C4 in a state where the positive electrodes of the plurality of capacitors C1 to C4 are electrically connected to the plurality of continuity check pads 1a to 1d, and where each of the plurality of connectors 4a to 4c is electrically disconnected from the second terminal corresponding to the one capacitor and the first terminal corresponding to the other capacitor; (II) after the check of establishment of electrical continuity between the plurality of continuity check pads 1a to 1d and the positive electrodes of the plurality of capacitors C1 to C4, electrically connecting each of the plurality of connectors 4a to 4c to the second terminal corresponding to the one capacitor and the first terminal corresponding to the other capacitor, and in this state, applying a voltage to the continuity check pad located on the first end side of the plurality of connectors 4a to 4c connected in series, and checking whether the lighting unit 40 is turned on; and (III) checking whether the voltage is applied to each of the plurality of capacitors C1 to C4 based on whether the lighting unit 40 is turned on or not turned on.

Third Exemplary Embodiment

Figure 5:
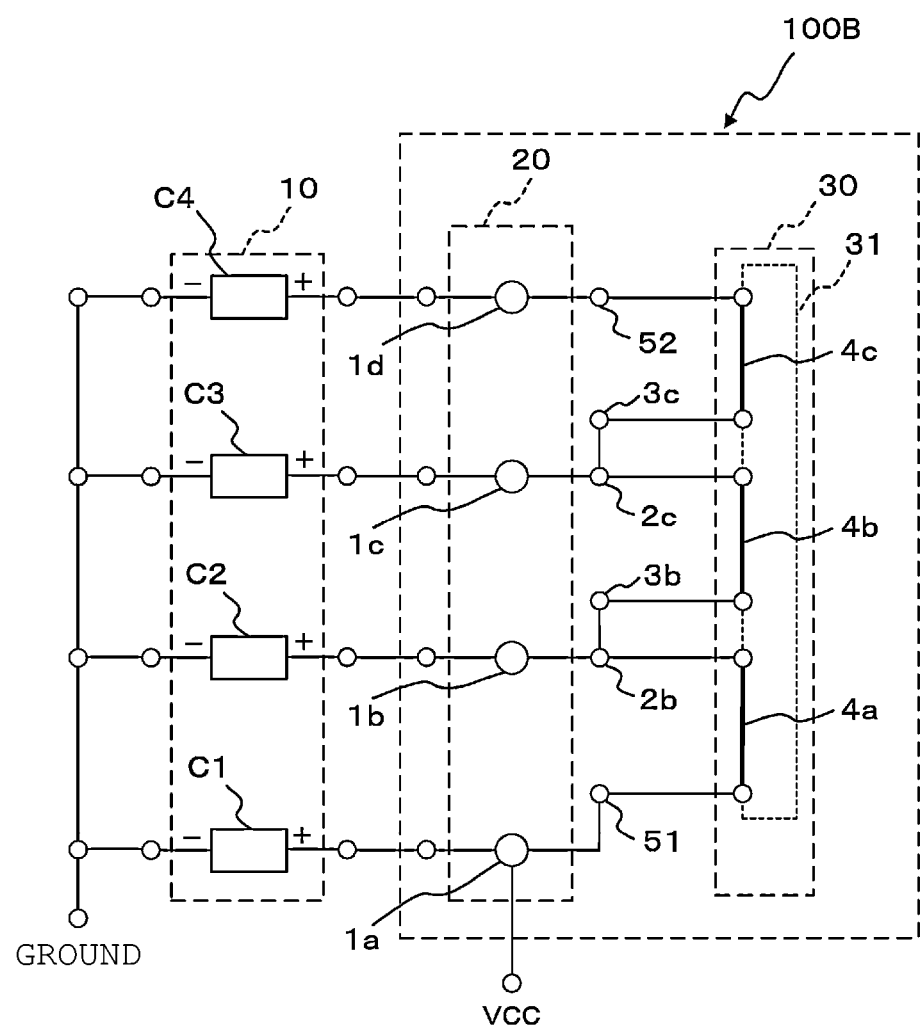
FIG. 5 is a diagram schematically illustrating a configuration of a capacitor aging apparatus according to a third exemplary embodiment, and illustrating a connection state where a plurality of capacitors are subjected to aging.

FIG. 5 is a diagram schematically illustrating a configuration of a capacitor aging apparatus 100B according to a third exemplary embodiment, and illustrating a connection state where a plurality of capacitors C1 to C4 are subjected to aging. The capacitor aging apparatus 100B according to the third embodiment differs from the capacitor aging apparatus 100 according to the first embodiment in a first integrated terminal 51 and a second integrated terminal 52.

In particular, the first integrated terminal 51 is one terminal obtained by integrating the first terminal 2a and the second terminal 3a located on the first end side of the plurality of connectors 4a to 4c connected in series in the capacitor aging apparatus 100 according to the first embodiment.

Likewise, the second integrated terminal 52 is one terminal obtained by integrating the first terminal 2d and the second terminal 3d located on the second end side of the plurality of connectors 4a to 4c connected in series in the capacitor aging apparatus 100 according to the first embodiment.

According to the capacitor aging apparatus 100B of the third exemplary embodiment, the number of terminals can be reduced as compared with the capacitor aging apparatus 100 of the first exemplary embodiment, and thus the manufacturing cost can also be reduced.

It is noted that the exemplary embodiments of the present invention are not limited to the above described embodiments, and various applications and modifications can be made within the scope of the present invention.

For example, in the configurations of the capacitor aging apparatuses 100, 100A, and 100B according to the respective embodiments described above, the electrical connection and disconnection between each of the plurality of connectors 4a to 4c and the second terminal corresponding to the one capacitor of the corresponding two capacitors and the first terminal corresponding to the other capacitor are achieved by attaching and detaching the second member 30 to and from the first member 20.

Figure 6:
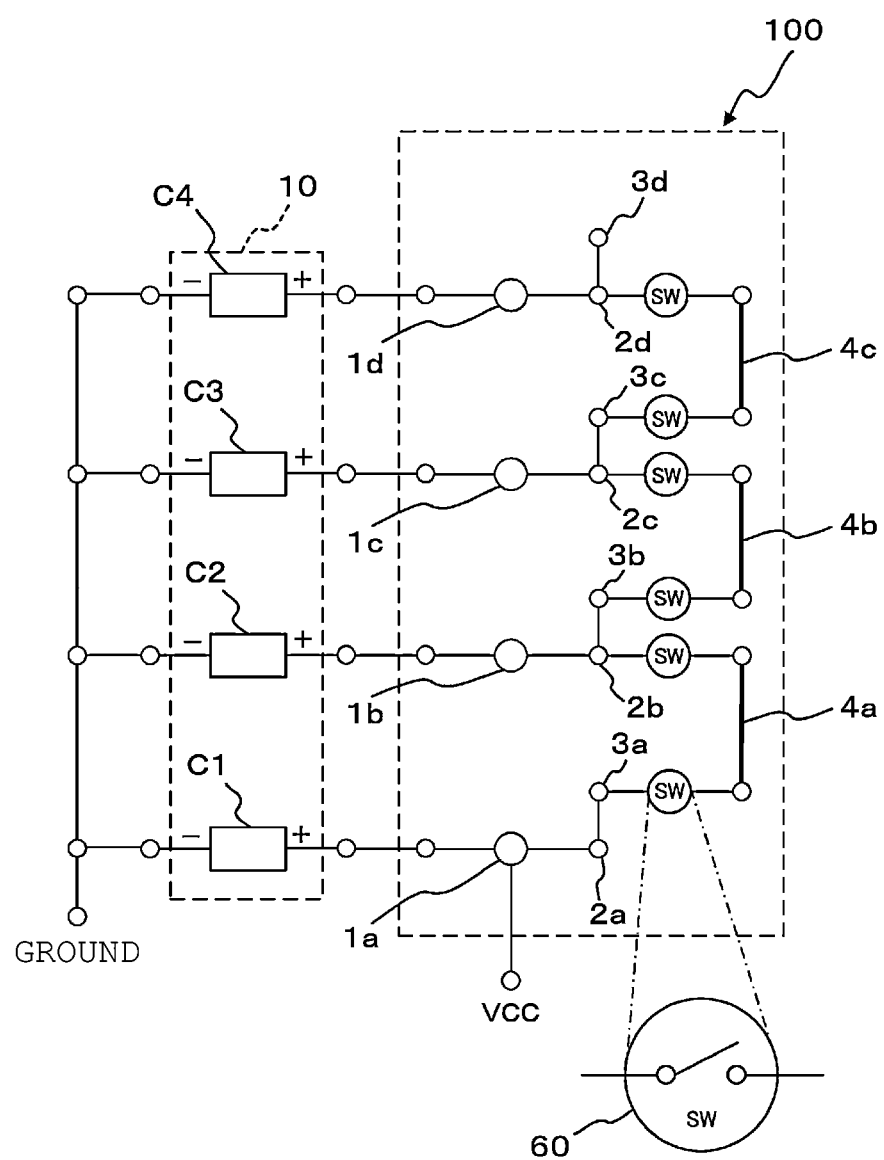
FIG. 6 is a diagram schematically illustrating a configuration of a capacitor aging apparatus including mechanical switches each configured to electrically connect and disconnect each of connectors to and from a second terminal corresponding to one capacitor of corresponding two capacitors and a first terminal corresponding to the other capacitor.

However, as illustrated in FIG. 6, mechanical switches 60 can be provided in alternative exemplary aspect, and turned on and off to thereby achieve the electrical connection and disconnection. The mechanical switches 60 are each configured to electrically connect and disconnect each of the connectors 4a to 4c to and from the second terminal corresponding to the one capacitor of the corresponding two capacitors and the first terminal corresponding to the other capacitor. The mechanical switches 60 are each a switch having a mechanical contact.

Figure 7:
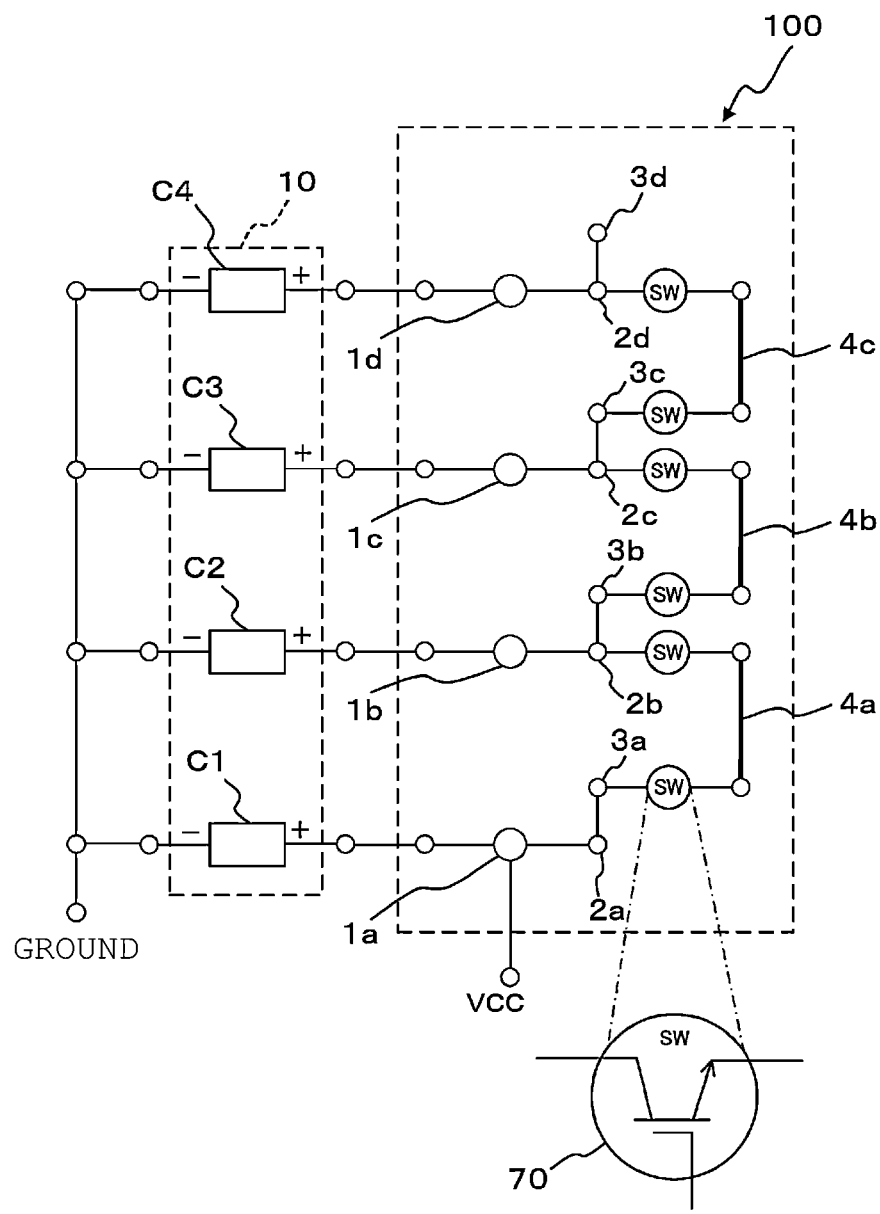
FIG. 7 is a diagram schematically illustrating a configuration of a capacitor aging apparatus including semiconductor switches each configured to electrically connect and disconnect each of connectors to and from a second terminal corresponding to one capacitor of corresponding two capacitors and a first terminal corresponding to the other capacitor.
Figure 8:
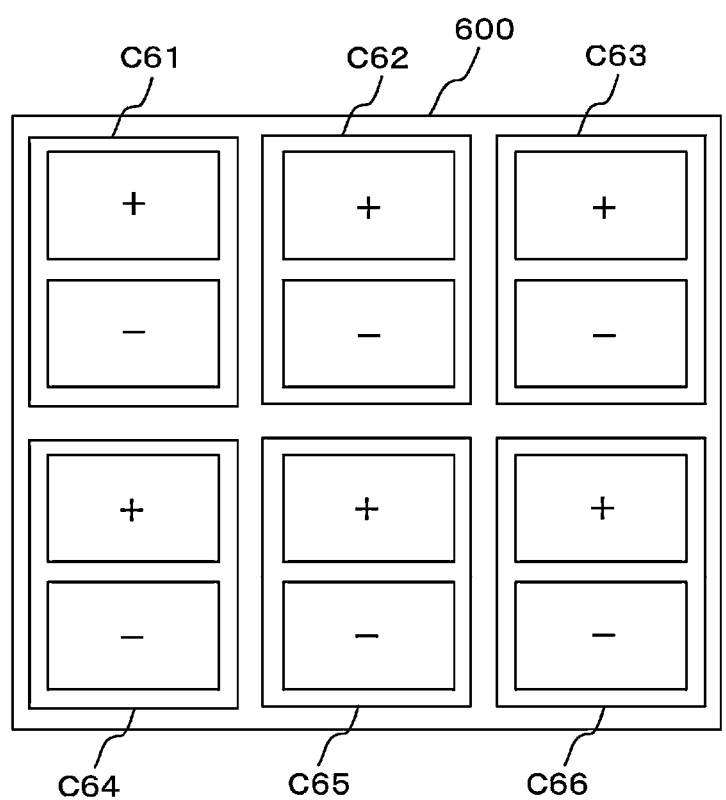
FIG. 8 is a diagram of a comparative example that schematically illustrates a configuration of an array capacitor in which a plurality of capacitors are combined into one.
Figure 9:
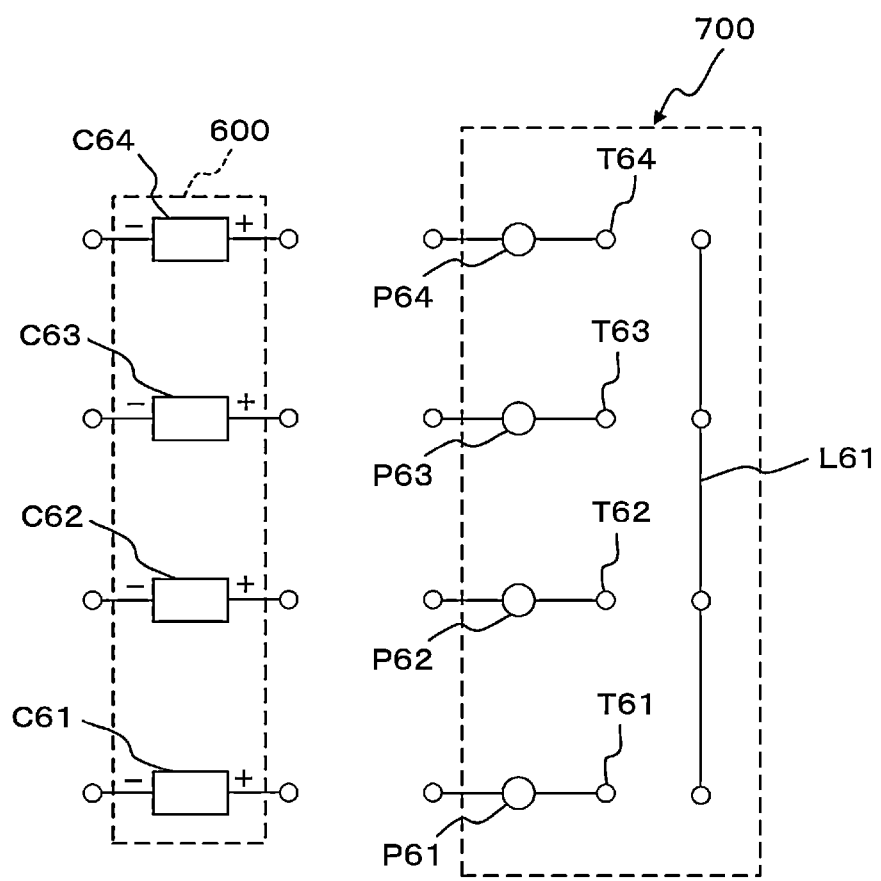
FIG. 9 is a diagram of a comparative example that schematically illustrates a configuration of a conventional aging apparatus that is connected to the array capacitor to perform aging.
Figure 10:
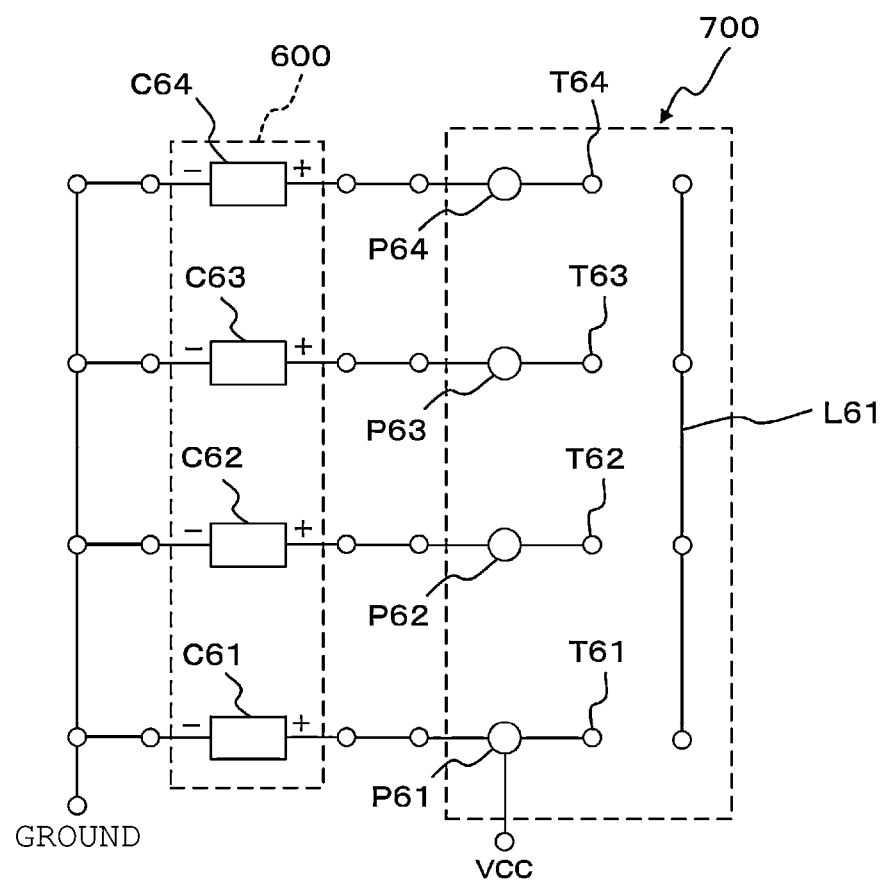
FIG. 10 is a diagram of a comparative example that schematically illustrates a connection state where electrical continuity between the array capacitor and the aging apparatus is checked in aging performed using the aging apparatus illustrated in FIG. 9.
Figure 11:
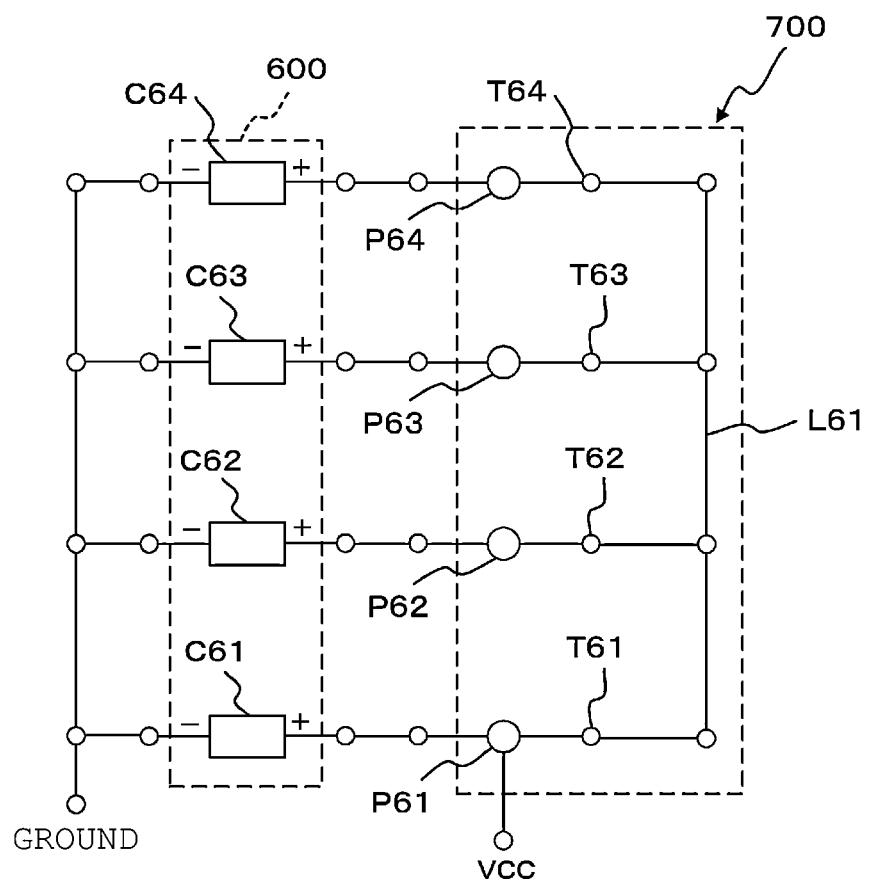
FIG. 11 is a diagram of a comparative example that schematically illustrates a connection state where aging is performed using the aging apparatus illustrated in FIG. 9.

Alternatively, as illustrated in FIG. 7, semiconductor switches 70 can be provided in another exemplary aspect, and turned on and off to thereby achieve the electrical connection and disconnection. The semiconductor switches 70 are each configured to electrically connect and disconnect each of the connectors 4a to 4c to and from the second terminal corresponding to the one capacitor of the corresponding two capacitors and the first terminal corresponding to the other capacitor. The semiconductor switches 70 are each a non-contact switch that is turned on and off according to a signal, such as an IGBT or a MOSFET, for example, as illustrated in FIG. 7.

In the first embodiment, such a configuration is employed that the power supply VCC is connected to the continuity check pad 1a corresponding to the first capacitor C1, and the voltage of the second terminal 3d corresponding to the fourth capacitor C4 is measured, thereby checking the electrical continuity between the first member 20 and the second member 30, that is, the electrical continuity between the plurality of continuity check pads 1a to 1d and the plurality of connectors 4a to 4c. On the other hand, the power supply VCC may be connected to the fourth continuity check pad 1d corresponding to the fourth capacitor C4, and a voltage at a position electrically connected to the first continuity check pad 1a corresponding to the first capacitor C1, for example, a voltage of the first terminal 2a may be measured, thereby checking electrical continuity between the first member 20 and the second member 30, that is, electrical continuity between the plurality of continuity check pads 1a to 1d and the plurality of connectors 4a to 4c.

In general, it should be appreciated that the characteristic configurations of the above-described embodiments and modifications can be appropriately combined as would be appreciated to one skilled in the art.

DESCRIPTION OF REFERENCE SYMBOLS

1a to 1d: Continuity check pad
2a to 2d: First terminal
3a to 3d: Second terminal
4a to 4c: Connector
10: Array capacitor
20: First member
30: Second member
31: Substrate
40: Lighting unit
51: First integrated terminal
52: Second integrated terminal
60: Mechanical switch
70: Semiconductor switch
100, 100A, 100B: Capacitor aging apparatus
600: Array capacitor
C1 to C4, C61 to C66: Capacitor
L61: Connector
P61 to P64: Continuity check pad
T61 to T64: Connection terminal
700: Conventional capacitor aging apparatus

The invention claimed is:

1. A capacitor aging apparatus comprising:
a plurality of continuity check pads configured to be electrically connected to positive electrodes of a plurality of capacitors in a one-to-one correspondence to check electrical continuity with the plurality of capacitors, respectively;
a plurality of first terminals electrically connected to the plurality of continuity check pads in a one-to-one correspondence;
a plurality of second terminals electrically connected to the plurality of first terminals in a one-to-one correspondence; and
a plurality of connectors configured to be electrically connected to and disconnected from the plurality of first terminals and the plurality of second terminals, and configured to electrically connect the positive electrodes of the plurality of capacitors, wherein the plurality of connectors are each configured to allow a second terminal corresponding to a first capacitor of a corresponding pair of capacitors among the plurality of capacitors to be electrically connected to a first terminal corresponding to a second capacitor of the pair of capacitors, and wherein when the plurality of capacitors are subjected to aging, in a state where in order to connect the plurality of connectors in series, each of the plurality of connectors is electrically connected to the second terminal corresponding to the first capacitor and the first terminal corresponding to the second capacitor of respective pairs of capacitors, and where the positive electrodes of the plurality of capacitors are electrically connected to the plurality of continuity check pads, a continuity check pad, among the plurality of continuity check pads, located on a first end side of the plurality of connectors connected in series is applied with a voltage, such that the voltage is applied to all of the plurality of capacitors via the plurality of connectors.

2. The capacitor aging apparatus according to claim 1, further comprising:
a first member that includes the plurality of continuity check pads, the plurality of first terminals, and the plurality of second terminals; and
a second member that includes the plurality of connectors, and that is attachable to and detachable from the first member.

3. The capacitor aging apparatus according to claim 2, wherein:
by attaching the second member to the first member, each of the plurality of connectors is electrically connected to the second terminal corresponding to the first capacitor and the first terminal corresponding to the second capacitor of the respective pairs of capacitors, and
by detaching the second member from the first member, each of the plurality of connectors is electrically disconnected from the second terminal corresponding to the first capacitor and the first terminal corresponding to the second capacitor of the respective pairs of capacitors.

4. The capacitor aging apparatus according to claim 1, further comprising a mechanical switch configured to electrically connect and disconnect each of the plurality of connectors to and from the second terminal corresponding to the first capacitor and the first terminal corresponding to the second capacitor of the respective pairs of capacitors.

5. The capacitor aging apparatus according to claim 1, further comprising a semiconductor switch configured to electrically connect and disconnect each of the plurality of connectors to and from the second terminal corresponding to the first capacitor and the first terminal corresponding to the second capacitor of the respective pairs of capacitors.

6. The capacitor aging apparatus according to claim 1, wherein:
a first terminal and a second terminal, among the plurality of first terminals and the plurality of second terminals, located on the first end side of the plurality of connectors connected in series are integrated to form a single terminal, and
a first terminal and a second terminal, among the plurality of first terminals and the plurality of second terminals, located on a second end side of the plurality of connectors connected in series are integrated to form a single terminal.

7. The capacitor aging apparatus according to claim 1, further comprising a lighting unit connected to a position electrically connected to a continuity check pad among the plurality of continuity check pads, located on a second end side of the plurality of connectors connected in series, and configured to turn on in response to application of the voltage to the continuity check pad located on the first end side of the plurality of connectors connected in series.

8. The capacitor aging apparatus according to claim 1, wherein the plurality of continuity check pads and the plurality of connectors are determined to be properly electrically connected when a voltage measured at one of the plurality of second terminals is a same voltage as the voltage applied to the continuity check pad.

9. The capacitor aging apparatus according to claim 1, further comprising a voltage comparator configured to compare a voltage measured at one of the plurality of second terminals with a predetermined threshold voltage to determine a proper electrical connection of the plurality of continuity check pads and the plurality of connectors when the measured voltage is greater than the predetermined threshold voltage.

10. A capacitor aging method, using the capacitor aging apparatus according to claim 1, for subjecting the plurality of capacitors to aging, the capacitor aging method comprising:
checking whether electrical continuity is established between the plurality of continuity check pads and the positive electrodes of the plurality of capacitors in a state where the positive electrodes of the plurality of capacitors are electrically connected to the plurality of continuity check pads, and where each of the plurality of connectors is electrically disconnected from the second terminal corresponding to the first capacitor and the first terminal corresponding to the second capacitor of the respective pairs of capacitors;
after the check of establishment of electrical continuity between the plurality of continuity check pads and the positive electrodes of the plurality of capacitors, electrically connecting each of the plurality of connectors to the second terminal corresponding to the first capacitor and the first terminal corresponding to the second capacitor of the respective pairs of capacitors, and in this state, applying a voltage to the continuity check pad located on the first end side of the plurality of connectors connected in series, and measuring a voltage at a position electrically connected to a continuity check pad, among the plurality of continuity check pads, located on a second end side of the plurality of connectors connected in series; and
checking whether the voltage is applied to each of the plurality of capacitors based on the voltage measured.

11. The capacitor aging method according to claim 10, wherein the checking comprises comparing the voltage measured with a predetermined threshold voltage.

12. A capacitor aging method, using the capacitor aging apparatus according to claim 7, for subjecting the plurality of capacitors to aging, the capacitor aging method comprising:
checking whether electrical continuity is established between the plurality of continuity check pads and the positive electrodes of the plurality of capacitors in a state where the positive electrodes of the plurality of capacitors are electrically connected to the plurality of continuity check pads, and where each of the plurality of connectors is electrically disconnected from the second terminal corresponding to the first capacitor and the first terminal corresponding to the second capacitor of the respective pairs of capacitors;

after the check of establishment of electrical continuity between the plurality of continuity check pads and the positive electrodes of the plurality of capacitors, electrically connecting each of the plurality of connectors to the second terminal corresponding to the first capacitor and the first terminal corresponding to the second capacitor of the respective pairs of capacitors, and in this state, applying a voltage to the continuity check pad located on the first end side of the plurality of connectors connected in series, and checking whether the lighting unit is turned on; and checking whether the voltage is applied to each of the plurality of capacitors based on whether the lighting unit is turned on.

13. A capacitor aging apparatus comprising:
a plurality of continuity check pads configured to be electrically connected to a plurality of capacitors, respectively, and to check electrical continuity of the plurality of capacitors;
a plurality of first terminals electrically connected to the plurality of continuity check pads, respectively;
a plurality of second terminals electrically connected to the plurality of first terminals, respectively; and
a plurality of connectors that are each configured to be electrically connected to and disconnected from a first terminal of the plurality of first terminals and a second terminal of the plurality of second terminals,
wherein the plurality of connectors are each configured to electrically connect the respective second terminal corresponding to one capacitor among the plurality of capacitors to the respective first terminal corresponding to another capacitor among the plurality of capacitors, and
wherein, when the plurality of capacitors are subjected to aging, in a state where in order to connect the plurality of connectors in series, each of the plurality of connectors is electrically connected to the respective second terminal and the respective first terminal, and where the plurality of capacitors are electrically connected to the plurality of continuity check pads, a continuity check pad, among the plurality of continuity check pads, located on a first end side of the plurality of connectors connected in series is applied with a voltage, such that the voltage is applied to all of the plurality of capacitors via the plurality of connectors.

14. The capacitor aging apparatus according to claim 13, further comprising:
a first member that includes the plurality of continuity check pads, the plurality of first terminals, and the plurality of second terminals; and
a second member that includes the plurality of connectors, and that is attachable to and detachable from the first member.

15. The capacitor aging apparatus according to claim 14, wherein:
by attaching the second member to the first member, each of the plurality of connectors is electrically connected to the respective second terminal and the respective first terminal, and
by detaching the second member from the first member, each of the plurality of connectors is electrically disconnected from the respective second terminal and the respective first terminal.

16. The capacitor aging apparatus according to claim 13, further comprising a mechanical switch configured to electrically connect and disconnect each of the plurality of connectors to and from the respective second terminals and the respective first terminals.

17. The capacitor aging apparatus according to claim 13, further comprising a semiconductor switch configured to electrically connect and disconnect each of the plurality of connectors to and from the respective second terminals and the respective first terminals.

18. The capacitor aging apparatus according to claim 13, wherein:
a first terminal and a second terminal, among the plurality of first terminals and the plurality of second terminals, located on the first end side of the plurality of connectors connected in series are integrated to form a single terminal, and
a first terminal and a second terminal, among the plurality of first terminals and the plurality of second terminals, located on a second end side of the plurality of connectors connected in series are integrated to form a single terminal.

19. The capacitor aging apparatus according to claim 13, further comprising a lighting unit connected to a position electrically connected to a continuity check pad among the plurality of continuity check pads, located on a second end side of the plurality of connectors connected in series, and configured to turn on in response to application of the voltage to the continuity check pad located on the first end side of the plurality of connectors connected in series.

20. The capacitor aging apparatus according to claim 13, further comprising a voltage comparator configured to compare a voltage measured at one of the plurality of second terminals with a predetermined threshold voltage to determine a proper electrical connection of the plurality of continuity check pads and the plurality of connectors when the measured voltage is greater than the predetermined threshold voltage.

* * * * *